United States Patent
Gill

(10) Patent No.: US 7,719,801 B2
(45) Date of Patent: May 18, 2010

(54) MAGNETORESISTIVE (MR) ELEMENT HAVING A CONTINUOUS FLUX GUIDE DEFINED BY THE FREE LAYER

(75) Inventor: Hardayal S. Gill, Palo Alto, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 972 days.

(21) Appl. No.: 11/379,162

(22) Filed: Apr. 18, 2006

(65) Prior Publication Data

US 2007/0242394 A1    Oct. 18, 2007

(51) Int. Cl.
G11B 5/39    (2006.01)
(52) U.S. Cl. .................................... 360/324.12
(58) Field of Classification Search .... 360/324.1–324.2
See application file for complete search history.

(56) References Cited

U.S. PATENT DOCUMENTS

| | | | |
|---|---|---|---|
| 5,731,937 A | 3/1998 | Yuan | |
| 5,867,889 A | 2/1999 | Dovek et al. | |
| 5,901,018 A | 5/1999 | Fontana, Jr. et al. | |
| 5,905,611 A | 5/1999 | Yoda et al. | |
| 6,064,552 A | 5/2000 | Iwasaki et al. | |
| 6,137,661 A | 10/2000 | Shi et al. | |
| 6,223,420 B1 | 5/2001 | Lee et al. | |
| 6,381,107 B1* | 4/2002 | Redon et al. | 360/324.2 |
| 6,538,859 B1 | 3/2003 | Gill | |
| 6,787,369 B2 | 9/2004 | Ishii et al. | |
| 6,847,510 B2* | 1/2005 | Childress et al. | 360/324.2 |
| 6,870,718 B2 | 3/2005 | Takahashi et al. | |
| 2003/0035249 A1* | 2/2003 | Ho et al. | 360/321 |
| 2003/0123198 A1 | 7/2003 | Sugawara et al. | |

FOREIGN PATENT DOCUMENTS

| | | |
|---|---|---|
| JP | 8339514 | 12/1996 |
| JP | 2001093118 | 4/2001 |
| JP | 2002252394 | 9/2002 |
| JP | 2002367122 | 12/2002 |
| JP | 2003069108 | 3/2003 |
| JP | 2004179579 | 6/2004 |

\* cited by examiner

*Primary Examiner*—A. J. Heinz
(74) *Attorney, Agent, or Firm*—Duft Bornsen & Fishman, LLP

(57) ABSTRACT

Magnetoresistive (MR) elements having flux guides defined by the free layer are disclosed. The MR element includes a free layer, a spacer/barrier layer, a pinned layer, and a pinning layer. A back edge of the free layer (opposite the sensing surface of the MR element) extends past a back edge of the spacer/barrier layer. The portion of the free layer extending past the back edge of the spacer/barrier layer defines a continuous flux guide. The flux guide is processed to reduce the conductive characteristics of the flux guide, thereby reducing current shunt loss in the flux guide.

33 Claims, 7 Drawing Sheets

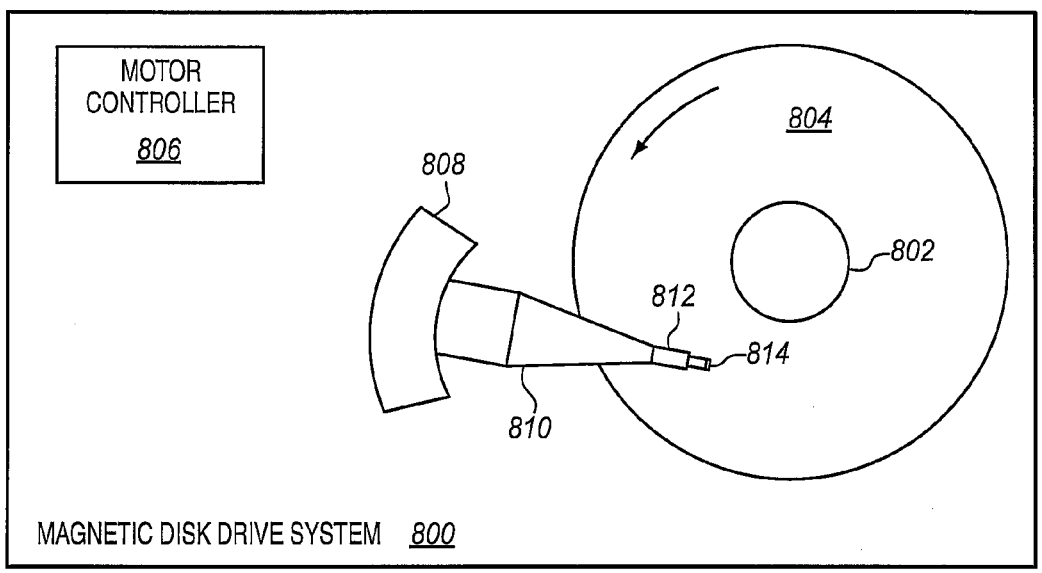
FIG. 8
FIG. 9
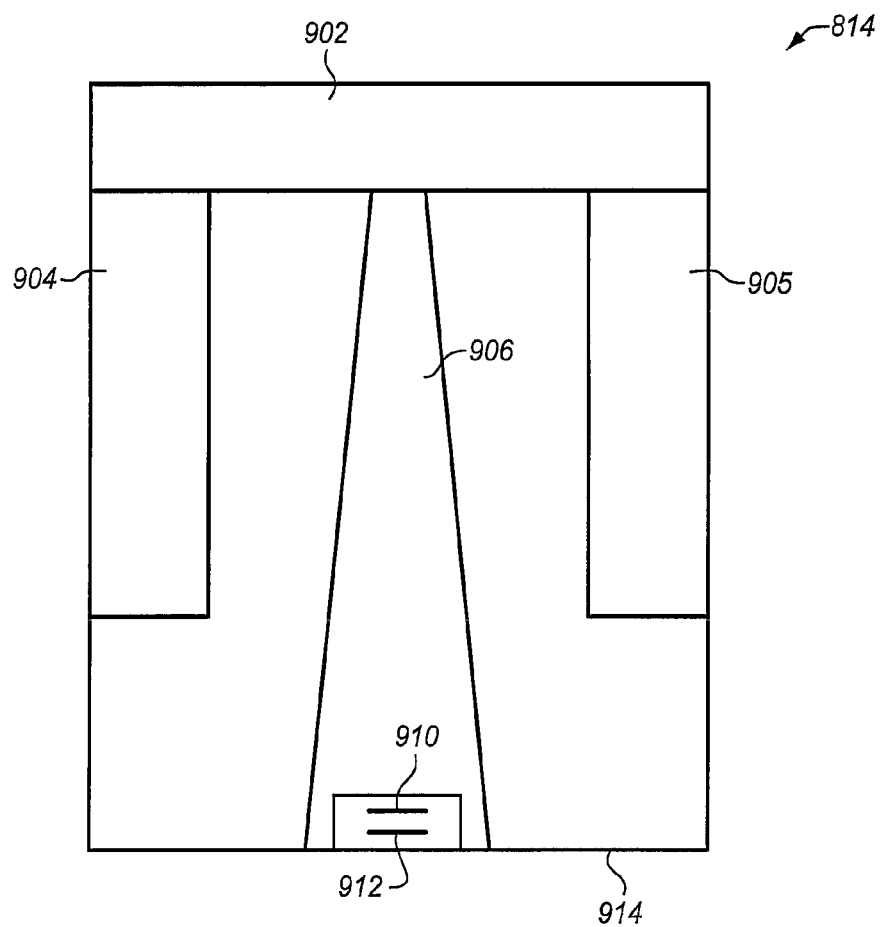

MAGNETORESISTIVE (MR) ELEMENT HAVING A CONTINUOUS FLUX GUIDE DEFINED BY THE FREE LAYER

BACKGROUND OF THE INVENTION

1. Field of the Invention

The invention is related to the field of magnetoresistive (MR) elements and, in particular, to (MR) elements having a continuous flux guide defined by the free layer. More particularly, the invention relates to a flux guide of an MR element that is processed to reduce the conductive characteristics of the flux guide.

2. Statement of the Problem

Many computer systems use magnetic disk drives for mass storage of information. Magnetic disk drives typically include one or more recording heads (sometimes referred to as sliders) that include read elements and write elements. A suspension arm holds the recording head above a magnetic disk. When the magnetic disk rotates, an air flow generated by the rotation of the magnetic disk causes an air bearing surface (ABS) side of the recording head to ride a particular height above the magnetic disk. The height depends on the shape of the ABS. As the recording head rides on the air bearing, an actuator moves an actuator arm that is connected to the suspension arm to position the read element and the write element over selected tracks of the magnetic disk.

To read data from the magnetic disk, transitions on a track of the magnetic disk create magnetic fields. As the read element passes over the transitions, the magnetic fields of the transitions modulate the resistance of the read element. The change in resistance of the read element is detected by passing a sense current through the read element and then measuring the change in voltage across the read element. The resulting signal is used to recover the data encoded on the track of the magnetic disk.

The most common type of read elements are magnetoresistive (MR) read elements. One type of MR read element is a Giant MR (GMR) read element. GMR read elements using two layers of ferromagnetic material (e.g., NiFe) separated by a layer of nonmagnetic material (e.g., Cu) are generally referred to as spin valve (SV) elements. A simple-pinned SV read element generally includes an antiferromagnetic (AFM) layer, a first ferromagnetic layer, a spacer layer, and a second ferromagnetic layer. The first ferromagnetic layer (referred to as the pinned layer) has its magnetization typically fixed (pinned) by exchange coupling with the AFM layer (referred to as the pinning layer). The pinning layer generally fixes the magnetic moment of the pinned layer perpendicular to the ABS of the recording head. The magnetization of the second ferromagnetic layer, referred to as a free layer, is not fixed and is free to rotate in response to the magnetic field from the magnetic disk. The magnetic moment of the free layer is free to rotate upwardly and downwardly with respect to the ABS in response to positive and negative magnetic fields from the rotating magnetic disk. The free layer is separated from the pinned layer by the spacer layer, which is nonmagnetic and electrically conducting.

Another type of spin valve read element is an antiparallel pinned (AP) SV read element. The AP-pinned SV read element differs from the simple pinned SV read element in that an AP-pinned structure has multiple thin film layers forming the pinned layer instead of a single pinned layer. The AP-pinned structure has an antiparallel coupling (APC) layer between first and second ferromagnetic pinned layers. The first pinned layer has a magnetization oriented in a first direction perpendicular to the ABS by exchange coupling with the AFM pinning layer. The second pinned layer is antiparallel exchange coupled with the first pinned layer because of the selected thickness of the APC layer between the first and second pinned layers. Accordingly, the magnetization of the second pinned layer is oriented in a second direction that is antiparallel to the direction of the magnetization of the first pinned layer.

Another type of MR read element is a Magnetic Tunnel Junction (MTJ) read element. The MTJ read element comprises first and second ferromagnetic layers separated by a thin, electrically insulating, tunnel barrier layer. The barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetic moments, or magnetization directions, of the two ferromagnetic layers. In the MTJ read element, the first ferromagnetic layer has its magnetic moment pinned (referred to as the pinned layer). The second ferromagnetic layer has its magnetic moment free to rotate in response to an external magnetic field from the magnetic disk (referred to as the free layer). When a sense current is applied, the resistance of the MTJ read element is a function of the tunneling current across the insulating layer between the ferromagnetic layers. The tunneling current flows perpendicularly through the tunnel barrier layer, and depends on the relative magnetization directions of the two ferromagnetic layers. A change of direction of magnetization of the free layer causes a change in resistance of the MTJ read element, which is reflected in voltage across the MTJ read element.

GMR read elements and MTJ read elements may be current in plane (CIP) read elements or current perpendicular to the planes (CPP) read elements. Read elements have first and second leads for conducting a sense current through the read element. If the sense current is applied parallel to the major planes of the layers of the read element, then the read element is termed a CIP read element. If the sense current is applied perpendicular to the major planes of the layers of the read element, then the read element is termed a CPP read element.

When a magnetic disk drive is in operation, the ABS (sensing surface) of the read element is positioned adjacent to the magnetic disk of the magnetic disk drive to sense the magnetic flux of the transitions on the magnetic disk. The magnetic flux enters the front edge of the free layer at the ABS. The magnetic flux decays from the front edge of the free layer to the back edge, and is restricted to about zero at the back edge. Thus, it is a problem that the magnetic flux is zero in the active region (the region of the free layer between the ABS and the back edge of the spacer layer or tunnel barrier layer) toward the back edge of the free layer.

One solution to this problem is to use a flux guide. A flux guide extends beyond the back edge of the free layer and beyond the active region. Because the flux guide extends beyond the active region, the magnetic flux is restricted to zero in the flux guide and is not restricted to zero in the active region of the free layer. The amount of magnetic flux in the active region is increased with the flux guide, which enhances the MR signal in the read element.

One problem with current flux guides is current shunt loss in the flux guide. When a sense current is applied to the read element, some of the sense current is shunted away from the active region of the free layer by the flux guide. The amount of sense current shunted away from the active region negatively affects the sensitivity of the read element. This can especially be a problem in CIP read elements when the sense current is applied parallel to the major planes of the read element.

SUMMARY OF THE SOLUTION

The invention solves the above and other related problems with a magnetoresistive (MR) element having a free layer that is extended to define a continuous flux guide. The flux guide is processed to reduce the conductive characteristics of the flux guide. By being less conductive and more resistive, the flux guide of the invention shunts less current than previous flux guides. Advantageously, more sensitive MR elements may be produced.

In one embodiment, an MR element of the invention includes a free layer, a spacer/barrier layer, a pinned layer, and a pinning layer. The free layer has a front edge coplanar with the sensing surface of the MR element. The free layer also has a back edge opposite the front edge. The spacer/barrier layer has a front edge coplanar with the sensing surface, and a back edge opposite the front edge. The back edge of the free layer extends past the back edge of the spacer/barrier layer away from the sensing surface. The portion of the free layer extending past the back edge of the spacer/barrier layer defines a continuous flux guide. The portion or region of the free layer adjacent to the spacer/barrier layer is referred to as the active region of the free layer. The flux guide in this embodiment is processed to reduce the conductive characteristics of the flux guide. As an example of processing the flux guide, the flux guide may be partially etched, oxidized, or otherwise processed to reduce the conductive characteristics of the flux guide.

Because the flux guide extends beyond the active region of the free layer, the magnetic flux is restricted to zero at the back edge of the flux guide and is not restricted to zero in the active region of the free layer. The amount of magnetic flux in the active region of the free layer is advantageously increased with the flux guide, which enhances the MR signal in the MR element. Further, because the conductive characteristics of the flux guide have been reduced, current shunt loss in the flux guide is advantageously reduced. The MR element of the invention thus has increased sensitivity.

The invention may include other exemplary embodiments described below.

DESCRIPTION OF THE DRAWINGS

The same reference number represents the same element on all drawings.

FIG. 8 illustrates a magnetic disk drive system in an exemplary embodiment of the invention.

FIG. 9 illustrates a recording head in an exemplary embodiment of the invention.

DETAILED DESCRIPTION OF THE INVENTION

FIGS. 1-11 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
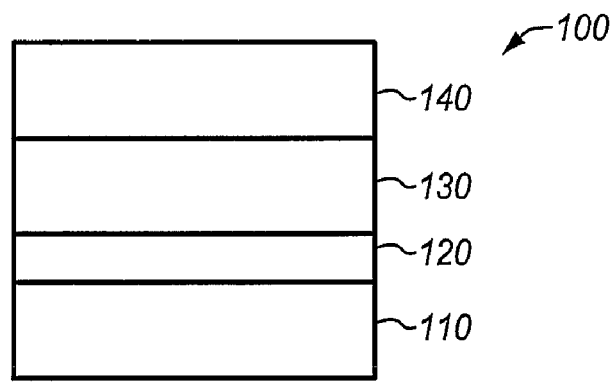
FIG. 1 illustrates a magnetoresistive (MR) element in an exemplary embodiment of the invention.

FIG. 1 illustrates a magnetoresistive (MR) element 100 in an exemplary embodiment of the invention. MR element 100 includes a free layer 110, a spacer/barrier layer 120, a pinned layer 130, and a pinning layer 140. MR element 100 may include other layers not shown in FIG. 1. MR element 100 may be a current in plane (CIP) MR element or a current perpendicular to the planes (CPP) MR element.

Free layer 110 comprises a ferromagnetic layer (such as CoFe) having a magnetic moment free to rotate in response to an external magnetic field. The magnetic moment of free layer 110 is generally parallel to a sensing surface of MR element 100 and parallel to the major planes of the layers of the MR element 100 in absence of an applied magnetic field. In FIG. 1, the sensing surface is along the plane of the page. The sensing surface of MR element 100 comprises the surface positioned adjacent to media or other device providing external magnetic fields being sensed by the MR element 100. For instance, the media may comprise a magnetic disk and the sensing surface may comprise the surface of MR element 100 positioned adjacent to the magnetic disk to sense the magnetic fields emitted from the magnetic disk.

Spacer/barrier layer 120 may comprise a spacer layer or a barrier layer depending on the desired configuration of MR element 100. A spacer layer is known to those skilled in the art as a layer of non-magnetic material such as Cu, Au, or Ag. A barrier layer is known to those skilled in the art as a thin layer of insulating material, such as $Al_2O_3$ or MgO, that allows for quantum-mechanical tunneling of charge carriers. As an example configuration, if MR element 100 comprises a giant magnetoresistive (GMR) (or spin valve) MR element, then spacer/barrier layer 120 comprises a spacer layer. If MR element 100 comprises a magnetic tunnel junction (MTJ) MR element, then spacer/barrier layer 120 comprises a barrier layer.

Pinned layer 130 comprises a ferromagnetic layer (such as CoFe) having a fixed magnetic moment. The magnetic moment of pinned layer 130 is fixed (pinned) by exchange coupling with pinning layer 140. Pinning layer 140 fixes the magnetic moment of pinned layer 130 perpendicular to the sensing surface. Pinning layer 140 typically comprises an antiferromagnetic (AFM) layer, such as IrMn or PtMn.

Figure 2:
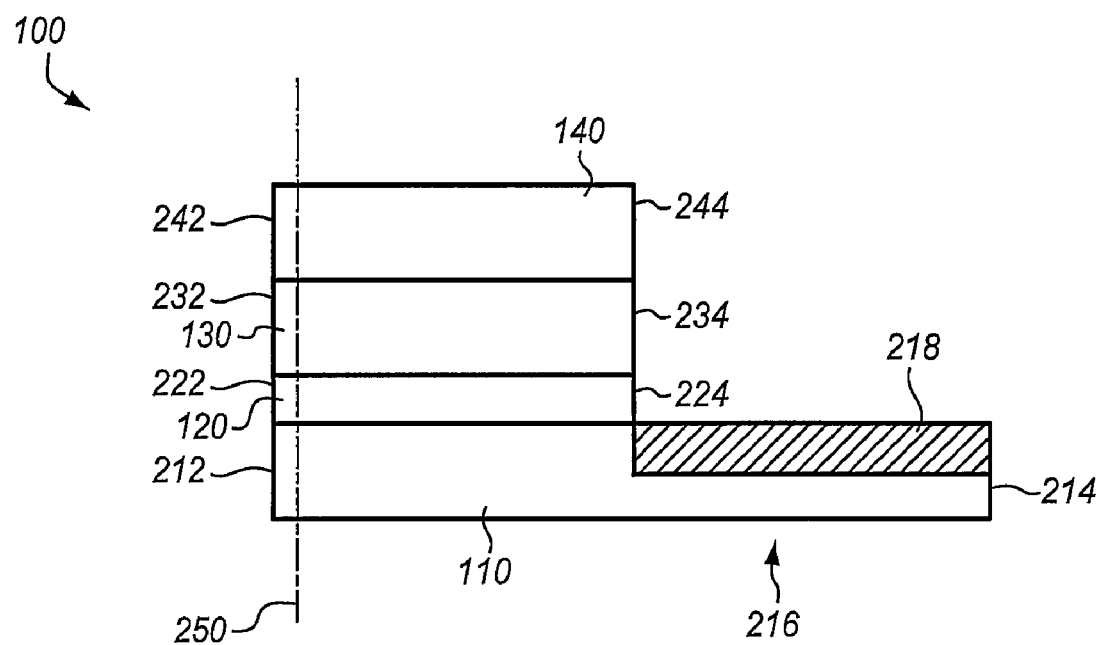
FIG. 2 is a cross-sectional view of the MR element in an exemplary embodiment of the invention.

FIG. 2 is a cross-sectional view of MR element 100 in an exemplary embodiment of the invention. The plane of the sensing surface 250 of MR element 100 is into and out of the page of FIG. 2. Free layer 110 has a front edge 212 coplanar with the sensing surface 250 of MR element 100. Free layer 110 also has a back edge 214 opposite the front edge 212. Spacer/barrier layer 120 has a front edge 222 coplanar with the sensing surface 250, and a back edge 224 opposite the front edge 224. Pinned layer 130 has a front edge 232 coplanar with the sensing surface 250, and a back edge 234 opposite the front edge 234. Pinning layer 140 has a front edge 242 coplanar with the sensing surface 250, and a back edge 244 opposite the front edge 244. Those skilled in the art understand that MR element 100 will be subsequently lapped to the sensing surface 250.

The back edge 214 of free layer 110 extends past the back edge 224 of spacer/barrier layer 120 away from the sensing surface 250. The portion of the free layer 110 extending past the back edge 224 of spacer/barrier layer 120 defines a continuous flux guide 216. The length of flux guide 216 is in the range of 0.5 to 2 times the length of spacer/barrier layer 120. The length of spacer/barrier layer 120 is measured from the front edge 222 to the back edge 224 of spacer/barrier layer 120. The portion or region of the free layer 110 adjacent to the spacer/barrier layer 120 is referred to as the active region of the free layer 110.

Flux guide 216 in this embodiment is processed to reduce the conductive characteristics of flux guide 216. Processing the flux guide 216 comprises any process, mechanical, chemical, or otherwise, that reduces the electrical conductive characteristics of flux guide 216. The magnetic characteristics of flux guide 216 may not be reduced by the process or may not be reduced to the extent of the conductive characteristics. As an example of processing the flux guide 216, flux guide 216 may be partially etched, oxidized, or otherwise processed to reduce the conductive characteristics of flux guide 216. The partially etched or oxidized portion of flux guide 216 is illustrated by the hatched portion 218 of flux guide 216. After processing, flux guide 216 has a resistance between about 250-450 ohms per square.

Because the flux guide 216 extends beyond the active region of the free layer 110, the magnetic flux is restricted to zero at the back edge 214 of the flux guide 216 and is not restricted to zero in the active region of the free layer 110. The amount of magnetic flux in the active region of the free layer 110 is advantageously increased with the flux guide 216, which enhances the MR signal in the MR element 100. Further, because the conductive characteristics of the flux guide 216 have been reduced, current shunt loss in the flux guide 216 is advantageously reduced. The MR element 100 has increased sensitivity, which is important in high density applications, such as a high density magnetic disk drive system. The flux guide 216 is also a continuous extension of the free layer 110.

The free layer 110 may have multiple desired configurations. In one embodiment, free layer 110 is comprised of two layers of ferromagnetic layers, such as a first layer of CoFe and the second layer of NiFe.

Figure 3:
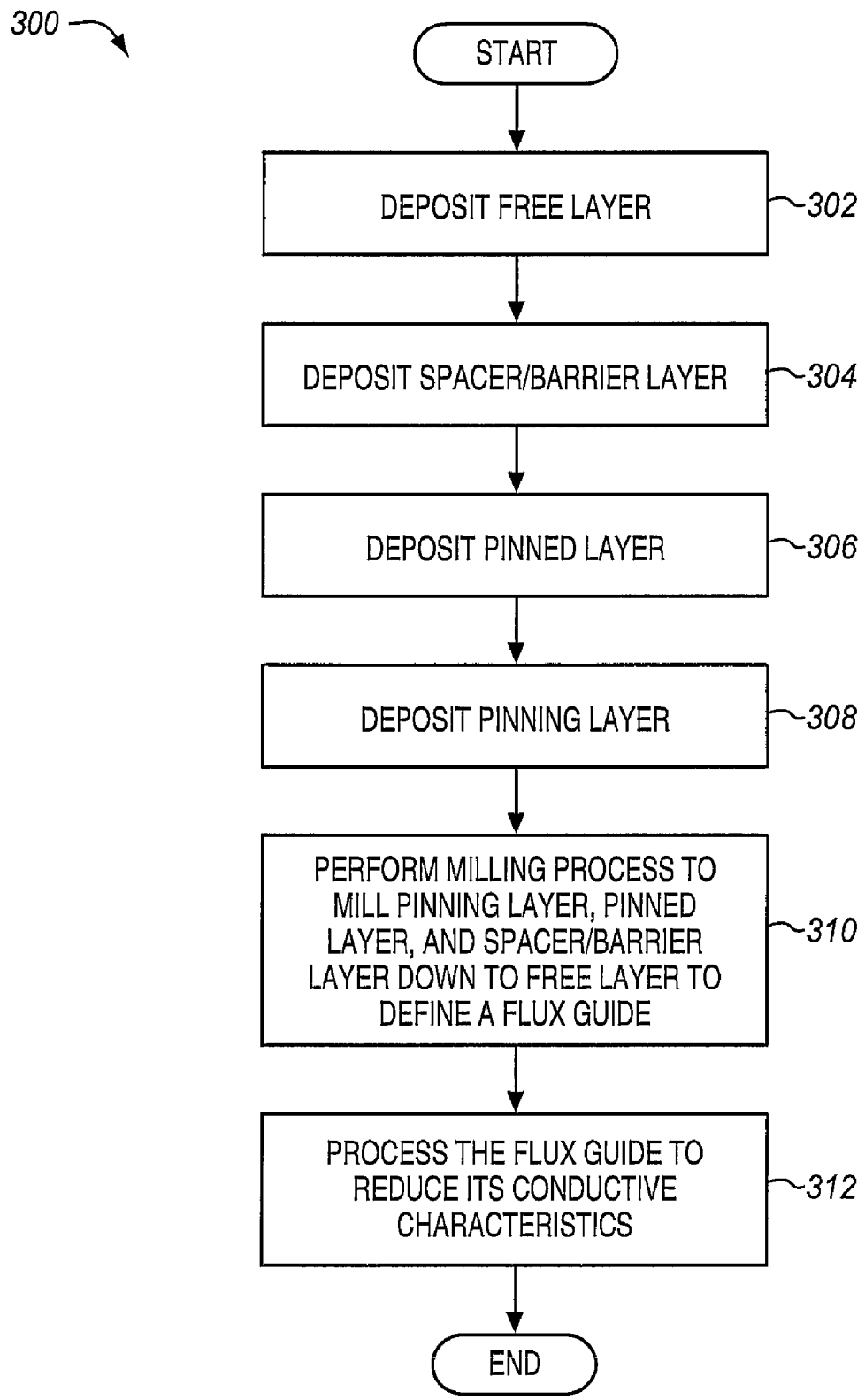
FIG. 3 is a flow chart illustrating a method of fabricating MR elements in an exemplary embodiment of the invention.

FIG. 3 is a flow chart illustrating a method 300 of fabricating MR elements in an exemplary embodiment of the invention. Method 300 will be described in relation to MR element 100 shown in FIGS. 1-2, but MR element 100 may be fabricated according to other desired fabrication methods.

Figure 4:
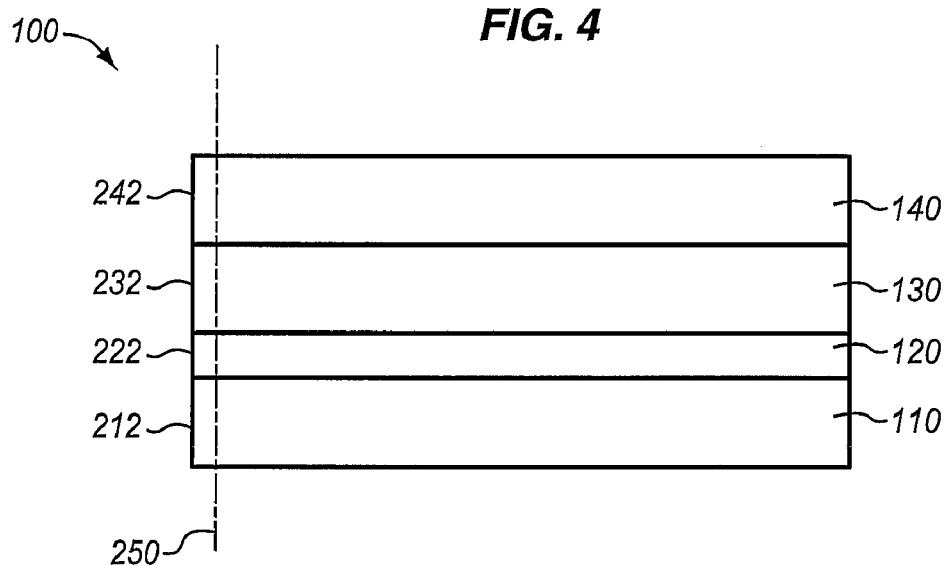
FIG. 4 is a cross-section view of the layers of an MR element deposited for the method of FIG. 3.

In step 302, free layer 110 is deposited having a front edge 212 coplanar with sensing surface 250 of MR element 100. In step 304, spacer/barrier layer 120 is deposited having a front edge 222 coplanar with the sensing surface 250. In step 306, pinned layer 130 is deposited having a front edge 232 coplanar with the sensing surface 250. In step 308, pinning layer 140 is deposited having a front edge 242 coplanar with the sensing surface 250. FIG. 4 is a cross-section view of the above layers after being deposited. Other layers, such as a cap layer, may be deposited according to method 300 as desired. FIG. 3 illustrates a general method 300 of fabrication, and those skilled in the art will understand that other derivations of fabrication may be used based on the teaching of FIG. 3.

Figure 5:
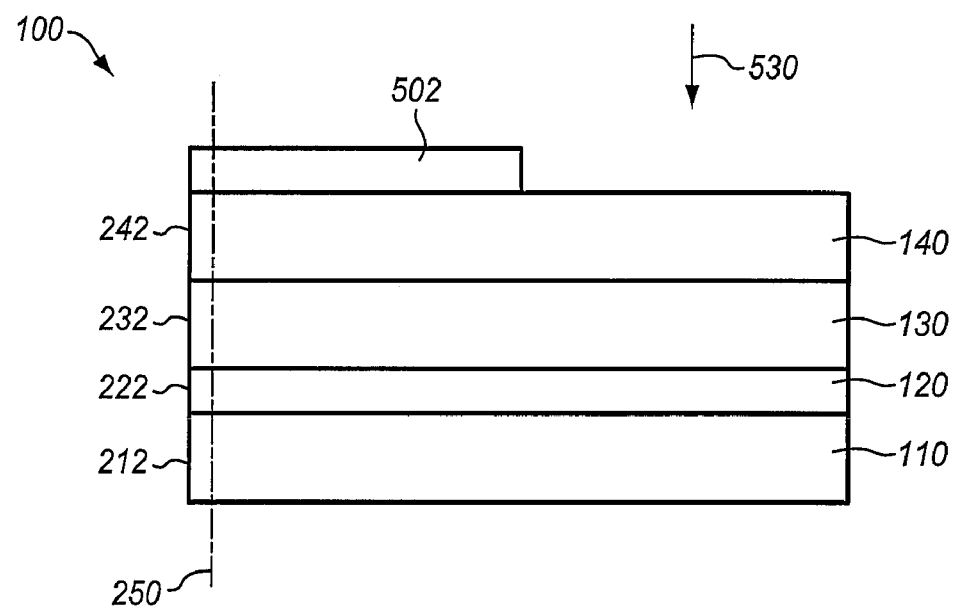
FIG. 5 illustrates a resist deposited on the layers of the MR element for the method of FIG. 3.

A resist 502 is deposited to define the desired shape of the layers 120, 130, 140 underneath the resist 502. FIG. 5 illustrates the resist 502 deposited on the layers of the MR element 100.

In step 310 of FIG. 3, a milling process 530 is performed to mill pinning layer 140, pinned layer 130, and spacer/barrier layer 120 down to free layer 110. The milling process 530 may mill partially into free layer 110 or mill to a top edge of free layer 110.

Figure 6:
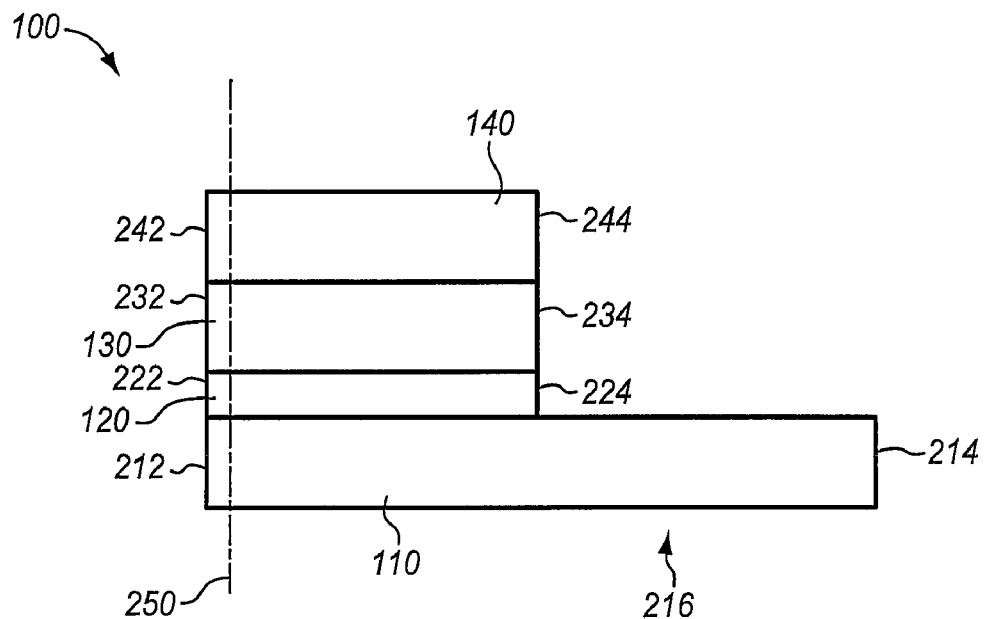
FIG. 6 illustrates the layers of the MR element after the milling process for the method of FIG. 3.

FIG. 6 illustrates the layers of the MR element 100 after the milling process. The milling process forms a back edge 244, 234, 224 for each of pinning layer 140, pinned layer 130, and spacer/barrier layer 120, respectively. After milling, the back edge 214 of free layer 110 extends past the back edge 224 of spacer/barrier layer 120 away from the sensing surface 250. The portion of the free layer 110 extending past the back edge 224 of spacer/barrier layer 120 defines a continuous flux guide 216.

Figure 7:
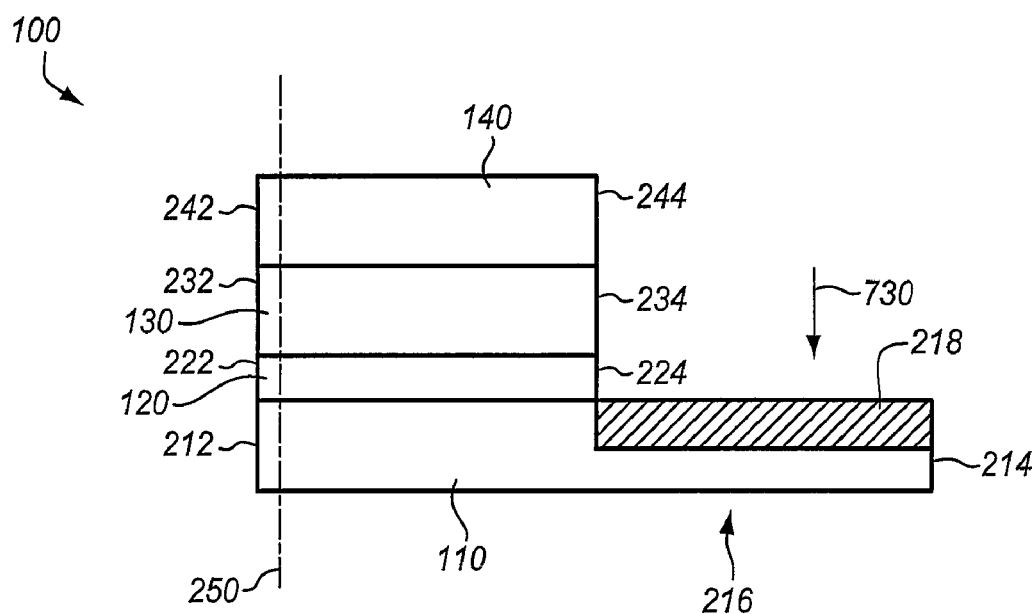
FIG. 7 illustrates the MR element after processing the flux guide for the method of FIG. 3.

In step 312 of FIG. 3, flux guide 216 is processed 730 in FIG. 7 to reduce the conductive characteristics of flux guide 216. For instance, flux guide 216 may be partially etched, oxidized, or otherwise processed to reduce the conductive characteristics of flux guide 216. FIG. 7 illustrates the MR element 100 after processing the flux guide 216. The partially etched or oxidized portion of flux guide 216 is illustrated by the hatched portion 218 of flux guide 216.

FIG. 8 illustrates a magnetic disk drive system 800 in an exemplary embodiment of the invention. Magnetic disk drive system 800 includes a spindle 802, a magnetic disk 804, a motor controller 806, an actuator 808, an actuator arm 810, a suspension arm 812, and a recording head 814. Spindle 802 supports and rotates a magnetic disk 804 in the direction indicated by the arrow. A spindle motor (not shown) rotates spindle 802 according to control signals from motor controller 806. Recording head 814 is supported by suspension arm 812 and actuator arm 810. Actuator arm 810 is connected to actuator 808 that is configured to rotate in order to position recording head 814 over a desired track of magnetic disk 804. Magnetic disk drive system 800 may include other devices, components, or systems not shown in FIG. 8. For instance, a plurality of magnetic disks, actuators, actuator arms, suspension arms, and recording heads may be used.

When magnetic disk 804 rotates, an air flow generated by the rotation of magnetic disk 804 causes an air bearing surface (ABS) of recording head 814 to ride on a cushion of air a particular height above magnetic disk 804. The height depends on the shape of the ABS. As recording head 814 rides on the cushion of air, actuator 808 moves actuator arm 810 to position a read element (not shown) and a write element (not shown) in recording head 814 over selected tracks of magnetic disk 804.

FIG. 9 illustrates recording head 814 in an exemplary embodiment of the invention. The view of recording head 814 is of the ABS side of recording head 814. Recording head 814 has a cross rail 902, two side rails 904-905, and a center rail 906 on the ABS side. The rails on recording head 814 illustrate just one embodiment, and the configuration of the ABS side of recording head 814 may take on any desired form. Recording head 814 also includes a write element 910 and a read element 912 on a trailing edge 914 of recording head 814.

Figure 10:
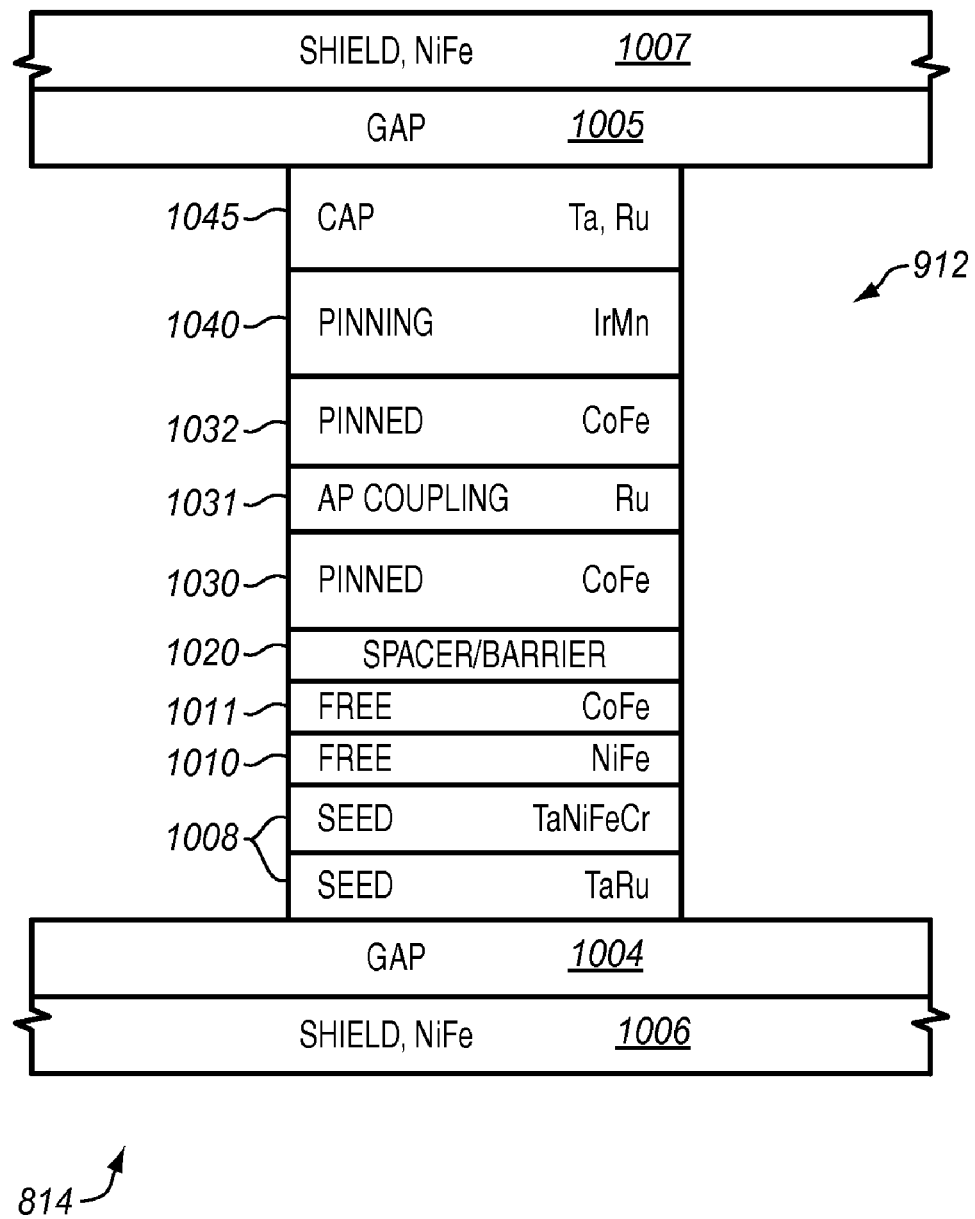
FIG. 10 illustrates the layers of the recording head in an exemplary embodiment of the invention.

FIG. 10 illustrates the layers of recording head 814 in an exemplary embodiment of the invention. The view of recording head 814 is from the air bearing surface (ABS) of recording head 814. The plane of the ABS is coplanar with the page of FIG. 10. Recording head 814 includes read element 912 sandwiched between a first gap layer 1004 and a second gap layer 1005. The first gap layer 1004 and the second gap layer 1005 are sandwiched between a first shield layer 1006 and a second shield layer 1007.

Read element 912 includes a seed layer 1008, a free layer 1010-1011, a spacer/barrier layer 1020, a pinned layer 1030-1032, a pinning layer 1040, and a cap layer 1045. The seed layer 1008 may comprise a first layer of TaRu and a second layer of TaNiFeCr. The free layer 1010-1011 comprises a first layer 1010 of NiFe and a second layer 1011 of CoFe. The spacer/barrier layer 1020 may comprise a spacer layer or a barrier layer depending on the desired configuration of read element 912. A spacer layer is known to those skilled in the art as a layer of non-magnetic material such as Cu, Au, or Ag. A barrier layer is known to those skilled in the art as a thin layer of insulating material, such as $Al_2O_3$ or MgO, that allows for quantum-mechanical tunneling of charge carriers. The pinned layer 1030-1032 includes a first ferromagnetic layer 1030 (such as CoFe) and a second ferromagnetic layer 1032 separated by an antiparallel coupling layer 1031, such as Ru. The pinning layer 1040 comprises a layer of antiferromagnetic (AFM) material, such as IrMn or PtMn.

Read element 912 is a current in plane (CIP) read element, but may comprise a current perpendicular to the planes (CPP) read element in other embodiments.

Figure 11:
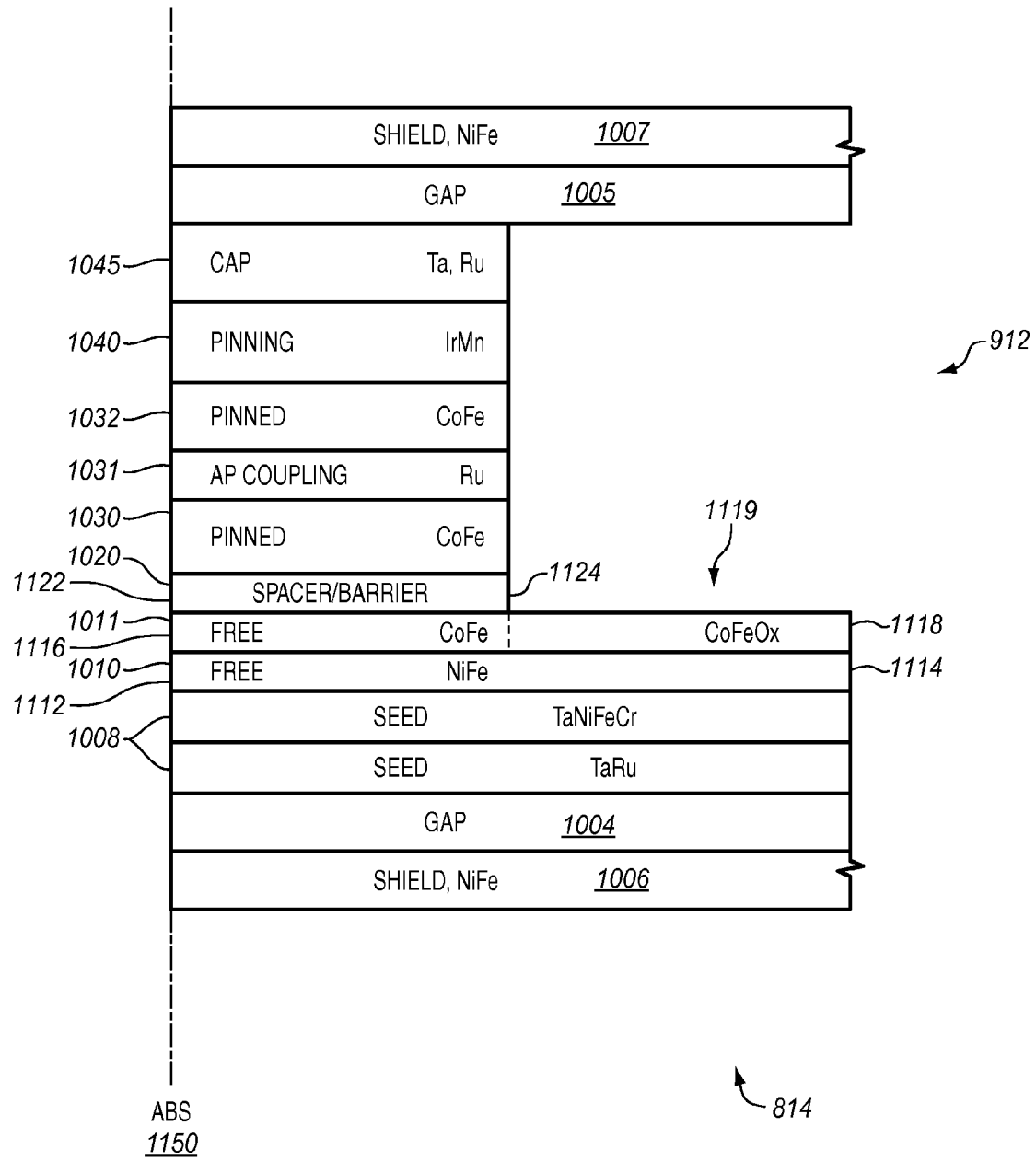
FIG. 11 is a cross-sectional view of the recording head in an exemplary embodiment of the invention.

FIG. 11 is a cross-sectional view of recording head 814 in an exemplary embodiment of the invention. Recording head 814 is lapped to form an air bearing surface (ABS) 1150. The NiFe layer 1010 of free layer 1010-1011 has a front edge 1112 coplanar with the ABS (sensing surface) 1150 of MR read element 912. The NiFe layer 1010 also has a back edge 1114 opposite the front edge 1112. The CoFe layer 1011 of free layer 1010-1011 has a front edge 1116 coplanar with the ABS 1150 and a back edge 1118 opposite the front edge 1116. Spacer/barrier layer 1020 has a front edge 1122 coplanar with the ABS 1150, and a back edge 1124 opposite the front edge 1122.

The back edge 1114 of the NiFe layer 1010 and the back edge 1118 of the CoFe layer 1011 both extend past the back edge 1124 of spacer/barrier layer 1020 away from the ABS 1150. The portion of the NiFe layer 1010 and the CoFe layer 1011 extending past the back edge 1124 of spacer/barrier layer 1020 defines a continuous flux guide 1119. The length of flux guide 1119 is in the range of 0.5 to 2 times the length of spacer/barrier layer 1020. The length of spacer/barrier layer 1020 is measured from the front edge 1122 to the back edge 1124 of spacer/barrier layer 1020.

Flux guide 1119 in this embodiment is processed to reduce the conductive characteristics of flux guide 1119. More particularly, the CoFe layer 1011 is etched, oxidized, or otherwise processed to male it non-conductive or to significantly reduce its conductive characteristics. As an example, assume that the flux guide 1119 is oxidized. The CoFe layer 1011 oxidizes more quickly than the NiFe layer 1010. Therefore, the conductive characteristics of the flux guide 1119 as a whole are reduced by oxidizing the CoFe layer 1011, but the flux guide 1119 still improves sensitivity because the NiFe layer 1010 is still conductive.

After processing, flux guide 1119 has a resistance between about 250-450 ohms per square. The flux guide 1119 exhibits only about a 7% current shunt loss, as opposed to about 30% current shunt loss in prior flux guide configurations.

The following lists example thicknesses and widths of the layers of read element 912. Shield layers 1006-1007 are about one micron thick. Cap layer 1045 is about 40 Å and pinning layer 1040 is about 150 Å thick. Pinned layer 1032 is about 20 Å, spacer layer 1031 is about 4 Å, pinned layer 1030 is about 20 Å thick. If spacer/barrier layer 1020 comprises a spacer layer (such as Cu), then spacer/barrier layer 1020 is about 20 Å thick. If spacer/barrier layer 1020 comprises a barrier layer, then spacer/barrier layer 1020 is about 5 Å thick. The CoFe layer 1011 of the free layer 1010-1011 is about 20 Å thick, and the NiFe layer 1010 of the free layer 1010-1011 is about 20 Å thick. The seed layer 1008 is about 10-20 Å thick.

A sense current may be conducted through read element 912 parallel to the plane of the layers of read element 912, which is into and out of the page in FIG. 11. Due to the direction of sense current through read element 912, read element 912 is considered a CIP read element. If a magnetic field from a rotating magnetic disk rotates the magnetic moment of free layer 1010-1011 to be more antiparallel to a magnetic moment of pinned layers 1030-1032, then the resistance of read element 912 increases. If a magnetic field from the rotating magnetic disk rotates the magnetic moment of free layer 1010-1011 to be more parallel to a magnetic moment of pinned layers 1030-1032, then the resistance of read element 912 decreases.

Read element 912 may be fabricated in a magnetron sputtering or an ion beam sputtering system to sequentially deposit the multilayer structure shown in FIG. 11. First, the shield layer 1006 is deposited on a substrate. The gap layer 1004 is then deposited on the shield layer 1006. The seed layer 1008 is then deposited on the gap layer 1004. The NiFe layer 1010 of the free layer 1010-1011 is deposited on the seed layer 1008, and the CoFe layer 1011 is deposited on the NiFe layer 1010. The spacer/barrier layer 1020 is deposited on the CoFe layer 1011. The pinned layers 1030-032 are deposited on the spacer/barrier layer 1020. The pinning layer 1040 is deposited on the pinned layer 1030-1032. The cap layer 1045 is then deposited on the pinning layer 1040.

Initially, each of the layers has a back edge substantially coplanar with the back edge 1114 of the NiFe layer 1010 and the back edge 1118 of the CoFe layer 1011. According to any desired fabrication process, the portions of the layers of the read element 912 away from the ABS are milled down to the CoFe layer 1011. This milling process defines the back edges of the pinning layer 1040, the pinned layer 1030-1032, and the spacer/barrier layer 1020. The back edge 1118 of the CoFe layer 1011 and the back edge 1114 of the NiFe layer 1010 extend past the back edge 1124 of the spacer/barrier layer 1020. The portion of the CoFe layer 1011 and the NiFe layer 1010 extending past the back edge 1124 of the spacer/barrier layer 1020 defines the flux guide 1119.

The flux guide 1119 is then etched, oxidized, or otherwise processed to reduce its conductive characteristics. As an example, assume that the flux guide 1119 is oxidized. The CoFe layer 1011 oxidizes more quickly than the NiFe layer 1010. Therefore, the conductive characteristics of the flux guide 1119 as a whole are reduced by oxidizing the CoFe layer 1011, but the flux guide 1119 still improves sensitivity because the NiFe layer 1010 is still conductive.

After processing the flux guide 1119, the gap created by the milling process is filled with insulation, such as $Al_2O_3$. The insulation deposition also forms the gap layer 1005. The shield layer 1007 is then deposited on the gap layer 1005. Those skilled in the art understand that other layers may be deposited as desired.

Although specific embodiments were described herein, the scope of the invention is not limited to those specific embodiments. The scope of the invention is defined by the following claims and any equivalents thereof.

I claim:

1. A magnetoresistive (MR) element, comprising:
   a pinning layer;
   a pinned layer;
   a spacer/barrier layer having a front edge coplanar with a sensing surface of the MR element, and having a back edge opposite the front edge; and
   a free layer having a front edge coplanar with the sensing surface, and having a back edge opposite the front edge, wherein the back edge of the free layer extends past the back edge of the spacer/barrier layer, wherein the portion of the free layer that extends past the back edge of the spacer/barrier layer defines a continuous flux guide;
   wherein the length of the flux guide is in the range of 0.5 to 2 times the length of the spacer/barrier layer;
   wherein the conductive characteristics of the flux guide have been reduced with a fabricating process.

2. The MR element of claim 1 wherein the flux guide is partially etched to reduce the conductive characteristics of the flux guide.

3. The MR element of claim 1 wherein the flux guide is partially oxidized to reduce the conductive characteristics of the flux guide.

4. The MR element of claim 1 wherein the free layer comprises:
   a first layer of NiFe; and
   a second layer of CoFe.

5. The MR element of claim 4 wherein the second layer of CoFe of the free layer defining the flux guide is etched to reduce the conductive characteristics of the flux guide.

6. The MR element of claim 4 wherein the second layer of CoFe of the free layer defining the flux guide is oxidized to reduce the conductive characteristics of the flux guide.

7. The MR element of claim 1 wherein the MR element comprises an MR read element for a recording head of a magnetic disk drive system.

8. The MR element of claim 7 wherein the MR read element comprises a current in plane (CIP) read element.

9. The MR element of claim 1 wherein the flux guide has a resistance in the range of 250-450 ohms per square.

10. A recording head of a magnetic disk drive system, the recording head comprising:
    a magnetoresistive (MR) read element operable to read data from a magnetic disk of the magnetic disk drive system, the MR read element comprising:
    a pinning layer;
    a pinned layer;
    a spacer/barrier layer having a front edge coplanar with an air bearing surface (ABS) of the MR read element, and having a back edge opposite the front edge; and
    a free layer having a front edge coplanar with the ABS, and having a back edge opposite the front edge, wherein the back edge of the free layer extends past the back edge of the spacer/barrier layer, wherein the portion of the free layer that extends past the back edge of the spacer/barrier layer defines a continuous flux guide;
    wherein the length of the flux guide is in the range of 0.5 to 2 times the length of the spacer/barrier layer;
    wherein the conductive characteristics of the flux guide have been reduced with a fabricating process.

11. The recording head of claim 10 wherein the flux guide is partially etched to reduce the conductive characteristics of the flux guide.

12. The recording head of claim 10 wherein the flux guide is partially oxidized to reduce the conductive characteristics of the flux guide.

13. The recording head of claim 10 wherein the free layer comprises:
    a first layer of NiFe; and
    a second layer of CoFe.

14. The recording head of claim 13 wherein the second layer of CoFe of the free layer defining the flux guide is etched to reduce the conductive characteristics of the flux guide.

15. The recording head of claim 13 wherein the second layer of CoFe of the free layer defining the flux guide is oxidized to reduce the conductive characteristics of the flux guide.

16. The recording head of claim 10 wherein the MR read element comprises a current in plane (CIP) read element.

17. The recording head of claim 10 wherein the flux guide has a resistance in the range of 250-450 ohms per square.

18. A recording head of a magnetic disk drive system, the recording head comprising:
    a first shield layer and a second shield layer;
    a first gap layer and a second gap layer; and
    a magnetoresistive (MR) read element sandwiched between the first and second gap layers which are sandwiched between the first and second shield layers, the MR read element is operable to read data from a magnetic disk of the magnetic disk drive system, the MR read element comprising:
    a cap layer;
    a pinning layer;
    a pinned layer;
    a spacer/barrier layer having a front edge coplanar with an air bearing surface (ABS) of the MR read element, and having a back edge opposite the front edge; and
    a free layer formed from a first material and a second material, the free layer having a front edge coplanar with the ABS, and having a back edge opposite the front edge, wherein the back edge of the free layer extends past the back edge of the spacer/barrier layer, wherein the portion of the free layer that extends past the back edge of the spacer/barrier layer defines a continuous flux guide; and
    a seed layer;
    wherein the length of the flux guide is in the range of 0.5 to 2 times the length of the spacer/barrier layer;
    wherein the conductive characteristics of the flux guide have been reduced with a fabricating process.

19. The recording head of claim 18 wherein the flux guide is partially etched to reduce the conductive characteristics of the flux guide.

20. The recording head of claim 18 wherein the flux guide is partially oxidized to reduce the conductive characteristics of the flux guide.

21. The recording head of claim 18 wherein the first material for the free layer comprises a first layer of NiFe, and the second material for the free layer comprises a second layer of CoFe.

22. The recording head of claim 21 wherein the second layer of CoFe of the free layer defining the flux guide is etched to reduce the conductive characteristics of the flux guide.

23. The recording head of claim 21 wherein the second layer of CoFe of the free layer defining the flux guide is oxidized to reduce the conductive characteristics of the flux guide.

24. The recording head of claim 18 wherein the MR read element comprises a current in plane (CIP) read element.

25. The recording head of claim 18 wherein the flux guide has a resistance in the range of 250-450 ohms per square.

26. A magnetic disk drive system, comprising:
a magnetic disk; and
a recording head having a magnetoresistive (MR) read element operable to read data from the magnetic disk, the MR read element comprising:
  a pinning layer;
  a pinned layer;
  a spacer/barrier layer having a front edge coplanar with an air bearing surface (ABS) of the MR read element, and having a back edge opposite the front edge; and
  a free layer having a front edge coplanar with the ABS, and having a back edge opposite the front edge, wherein the back edge of the free layer extends past the back edge of the spacer/barrier layer, wherein the portion of the free layer that extends past the back edge of the spacer/barrier layer defines a continuous flux guide;
  wherein the length of the flux guide is in the range of 0.5 to 2 times the length of the spacer/barrier layer;
  wherein the conductive characteristics of the flux guide have been reduced with a fabricating process.

27. The magnetic disk drive system of claim 26 wherein the flux guide is partially etched to reduce the conductive characteristics of the flux guide.

28. The magnetic disk drive system of claim 26 wherein the flux guide is partially oxidized to reduce the conductive characteristics of the flux guide.

29. The magnetic disk drive system of claim 26 wherein the free layer comprises:
  a first layer of NiFe; and
  a second layer of CoFe.

30. The magnetic disk drive system of claim 29 wherein the second layer of CoFe of the free layer defining the flux guide is etched to reduce the conductive characteristics of the flux guide.

31. The magnetic disk drive system of claim 29 wherein the second layer of CoFe of the free layer defining the flux guide is oxidized to reduce the conductive characteristics of the flux guide.

32. The magnetic disk drive system of claim 26 wherein the MR read element comprises a current in plane (CIP) read element.

33. The magnetic disk drive system of claim 26 wherein the flux guide has a resistance in the range of 250-450 ohms per square.

* * * * *

UNITED STATES PATENT AND TRADEMARK OFFICE
CERTIFICATE OF CORRECTION

PATENT NO. : 7,719,801 B2
APPLICATION NO. : 11/379162
DATED : May 18, 2010
INVENTOR(S) : Gill It is certified that error appears in the above-identified patent and that said Letters Patent is hereby corrected as shown below:

In column 7, line 52, the text "processed to male it non-conductive" should read "processed to make it non-conductive".

Signed and Sealed this

Ninth Day of November, 2010

David J. Kappos
*Director of the United States Patent and Trademark Office*